(12) United States Patent
Hong et al.

(10) Patent No.: US 7,074,725 B2
(45) Date of Patent: *Jul. 11, 2006

(54) METHOD FOR FORMING A STORAGE NODE OF A CAPACITOR

(75) Inventors: Jun-Sik Hong, Gyeonggi-do (KR);
Young-Ki Hong, Gyeonggi-do (KR);
Tae-Hyuk Ahn, Gyeonggi-do (KR);
Jong-Seo Hong, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 96 days.

This patent is subject to a terminal disclaimer.

(21) Appl. No.: 10/641,636

(22) Filed: Aug. 14, 2003

(65) Prior Publication Data
US 2004/0048475 A1 Mar. 11, 2004

(30) Foreign Application Priority Data
Sep. 7, 2002 (KR) ............... 10-2002-0054003

(51) Int. Cl.
*H01L 21/302* (2006.01)
(52) U.S. Cl. ............... 438/724; 438/253; 438/692; 438/701; 438/723; 438/740; 438/756; 438/757; 216/89
(58) Field of Classification Search ......... 216/88–91; 438/690–693, 700, 702, 706, 710, 714, 723, 438/724, 738, 740, 745, 756, 757, 250–256, 438/393–399, 701
See application file for complete search history.

(56) References Cited

U.S. PATENT DOCUMENTS

| | | | | |
|---|---|---|---|---|
| 5,763,306 A | * | 6/1998 | Tsai | 438/255 |
| 5,792,689 A | * | 8/1998 | Yang et al. | 438/255 |
| 6,300,191 B1 | * | 10/2001 | Yu et al. | 438/253 |
| 6,528,368 B1 | * | 3/2003 | Park | 438/253 |
| 6,531,778 B1 | * | 3/2003 | Ando | 257/758 |
| 6,696,336 B1 | * | 2/2004 | DeBoer et al. | 438/253 |

OTHER PUBLICATIONS

Wolf et al., Silicon Processing for the VLSI Era, 1986, Lattice Press, vol. 1, pp. 185-186, 399-400.*
Wolf, Silicon Processing for the VLSI Era, 1992, Lattice Press, vol. 2, p. 102.*
Wolf et al., Silicon Processing for the VLSI Era, 1986, Lattice Press, vol. 1, pp. 171, 531-532.*

* cited by examiner

*Primary Examiner*—Nadine G. Norton
*Assistant Examiner*—Eric B. Chen
(74) *Attorney, Agent, or Firm*—Marger Johnson & McCollom, P.C.

(57) ABSTRACT

An improved method of manufacturing a capacitor on a semiconductor substrate is disclosed. A portion of an insulation film on a semiconductor substrate is etched to form a first opening in the insulation film. A passivation film is formed on the insulation film and within the first opening thereof. A portion of the passivation film on a bottom of the first opening is thinner than portions of the passivation film on the insulation film and on a sidewall of the first opening. The passivation film is etched to expose the bottom of the first opening.

25 Claims, 12 Drawing Sheets

METHOD FOR FORMING A STORAGE NODE OF A CAPACITOR

CROSS REFERENCE TO RELATED APPLICATIONS

This application claims priority from Korean Patent Application No. 2002-54003, filed on Sep. 7, 2002, the contents of which are incorporated herein by reference in their entirety.

BACKGROUND OF THE INVENTION

1. Field of the Invention

The present invention relates to a method for forming a storage node of a capacitor, and more particularly to a method for forming a storage node of a capacitor directly connected to an underlying conductive region.

2. Description of the Related Art

As the information society rapidly develops, semiconductor devices are required to have rapid processing speed for handling much information. Thus, cells should be highly integrated in one chip. There have been many efforts to reduce the design rule of the semiconductor in order to integrate a number of cells in one semiconductor device.

In accordance with the increasing integration of the semiconductor device, the metal wiring of the semiconductor device is formed using tungsten so as to improve the operation speed of the semiconductor device. However, an oxide film may be abnormally grown on the tungsten metal wiring due to its intrinsic properties during the thermal process for manufacturing the semiconductor device.

Figure 1A:
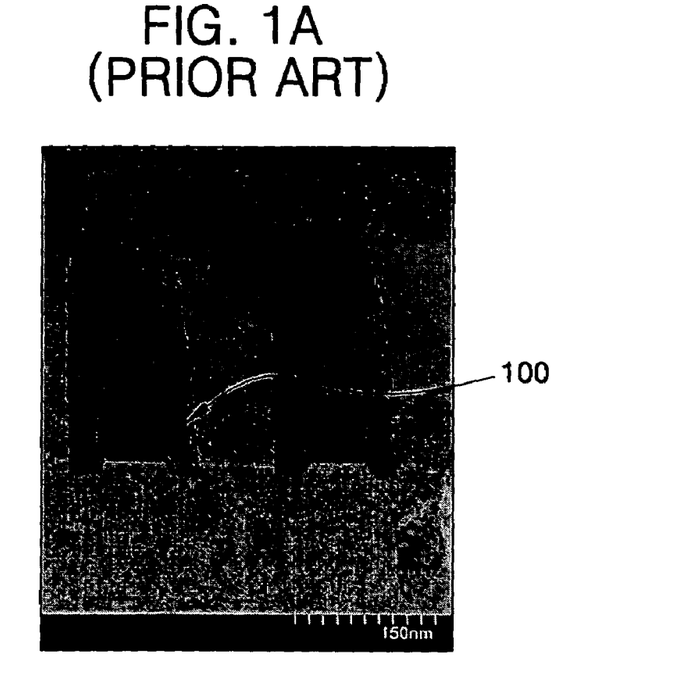
FIG. 1A is a cross-sectional scanning electron microscope (SEM) picture showing a bit line including tungsten.

FIG. 1A is a cross-sectional picture showing the bit line including tungsten obtained by a scanning electron microscope (SEM).

As shown in FIG. 1A, an oxide film is abnormally grown on a region 100 of a bit line toward a sidewall of the bit line. When the metal wiring having the abnormally grown oxide film is exposed in the adjacent open region so that the metal wiring is used as an electrical passage, a failure such as an electrical short is caused.

A spacer is additionally formed on the sidewall of the bit line to overcome the above-mentioned problem, however, the cost for manufacturing the semiconductor device may increase due to the formation of the spacer.

As for a dynamic random access memory (DRAM) having cell elements such as a transistor and a capacitor, the area for forming the cell elements should be reduced in order to fabricate a highly integrated DRAM. Though the capacitor is formed in the diminished area, the storage capacitance of the capacitor should be sufficiently maintained because the capacitor should have an adequate data storage capacity to operate as a data storage element.

When the size of the memory cell is reduced in accordance with the high integration of the semiconductor device, the size of the capacitor also decreases. Thus, the storage capacitance of the capacitor may be reduced. Hence, the storage node of the memory cell capacitor should have a wider surface area to store as much charge that is needed to maintain a desired storage capacitance. As a result, a capacitor having a three-dimensional structure like a cylinder has been developed to ensure sufficient storage capacitance by increasing the surface area of the storage node. When the height of the storage node increases in order to have a wider surface area, the aspect ratio of the storage node also increases, thereby deteriorating the structural stability of the storage node and causing the storage node to fall down.

Figure 1B:
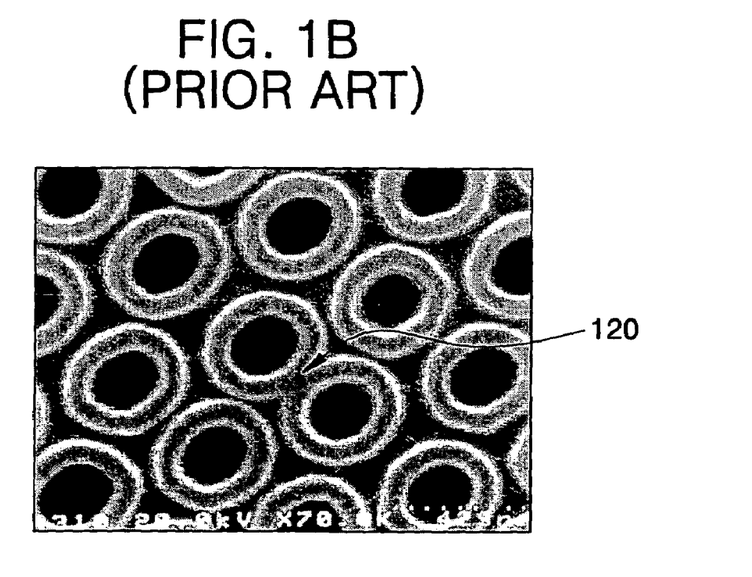
FIG. 1B is a plan view of storage nodes of a conventional capacitor obtained by an SEM.

Referring to FIG. 1B, a bridge 120 is generated by contacts between adjacent storage nodes due to a toppled storage node. The bridge 120 can cause the failure such as the electric short, so the wrong operation of the semiconductor device may occur. In addition, the performance of the semiconductor device may deteriorate because the contacting area between the storage node and an underlying contact region or a conductive pattern becomes narrower. Furthermore, when a contact is formed to electrically connect a storage node with an underlying conductive region or a conductive pattern, the resistance in the interface between the contact and the underlying conductive region or the conductive pattern may increase, so that the performance of the semiconductor device may further deteriorate.

To reduce the resistance in the interface in a contact region, there is provided a method for forming the storage node into the contact region as disclosed in U.S. Pat. No. 6,342,419. According to the above-mentioned method, however, a wet etching process is excessively performed to form an opening for forming a storage node pattern in order to increase the capacitance of the capacitor. Thus, according to the reduction of the design rule, adjacent patterns may make contact with each other to cause the electrical short. Also, the storage node pattern formed by the wet etching process may have an increasingly unstable structure as the height of the storage node pattern increases.

SUMMARY OF THE INVENTION

In one embodiment, a portion of an insulation film on a semiconductor substrate is etched to form a first opening in the insulation film. A passivation film is formed on the insulation film and within the first opening thereof. A portion of the passivation film on a bottom of the first opening is thinner than portions of the passivation film on the insulation film and on a sidewall of the first opening. The passivation film is etched to expose the bottom of the first opening.

In another embodiment of the invention, a predetermined portion of an insulation film formed on a semiconductor substrate is etched to form a first opening through the insulation film. The first opening exposes a conductive pad formed on the semiconductor substrate. In this case, more than one conductive pattern is positioned adjacent to the first opening.

A passivation film is coated on the insulation film, on a sidewall of the first opening, and on a bottom of the first opening through a plasma-enhanced chemical vapor deposition process or an atmospheric pressure chemical vapor deposition process. The portions of the passivation film on the insulation film and the sidewall of the first opening have thicknesses twice that of the portion of the passivation film formed on the bottom of the first opening.

The passivation film is etched such that the bottom of the first opening is exposed only. A first oxide is coated on the passivation film to fill the first opening so that a buried layer is formed in the first opening. Particularly, the buried layer is formed through etching a first oxide film using the passivation film as an etching stop film after the first oxide film is formed to fill the first opening.

An interlayer dielectric film is formed on the passivation film including the buried layer. A second opening is formed by anisotropically etching the interlayer dielectric film until a top surface of the buried layer is exposed.

The first opening is exposed again when the buried layer exposed through the second opening is etched. Preferably, the buried layer is etched at least five times faster than the interlayer dielectric film.

A conductive film is formed on the interlayer dielectric film where the first and the second openings are formed. The conductive film is defined to form the conductive patterns along the bottom and the sidewalls of the first and second openings. When the interlayer dielectric film is removed using the passivation film as the etching stop film, a storage node of the capacitor is completed.

According to the embodiment of the invention, the conductive patterns, including tungsten, are formed on the first insulation film that is formed on the semiconductor substrate.

The second insulation film is formed on the first insulation film, and a predetermined portion of the second insulation film between the conductive patterns is etched. Then, the portion of the first insulation film is successively etched so that the first opening is formed through the first and second insulation films. Otherwise, the first opening can be formed using a self-aligned contact process.

A nitride film is formed on the second insulation film where the first opening is formed. At this time, the portion of the nitride film on the bottom of the first opening has a thickness thinner than other portions of the nitride film positioned on the second insulation film and on the sidewall of the first opening.

The nitride film is etched to expose the bottom of the first opening only. The first oxide is coated in the first opening such that the buried layer is formed in the first opening.

The interlayer dielectric film is formed on the buried layer and on the nitride film. The portion of the interlayer dielectric film is anisotropically etched until a top surface of the buried layer is exposed, thereby forming the second opening through the interlayer dielectric film.

The first opening is exposed again when the buried layer exposed through the second opening is preferably wet etched. The doped polysilicon film is uniformly or conformally coated on the interlayer dielectric film where the first and the second openings are formed. The portion of the doped polysilicon film on the interlayer dielectric film is etched to form the doped polysilicon pattern formed along the first and the second openings.

The interlayer dielectric film is etched using the nitride film as the etching stop film so that the storage node of the capacitor is completed.

BRIEF DESCRIPTION OF THE DRAWINGS

The above features and advantages of the present invention will become more readily apparent by describing in detail exemplary through the following detailed description of preferred embodiments thereof, made with reference to the attached drawings, in which.

DETAILED DESCRIPTION OF THE PREFERRED EMBODIMENTS

It should be understood that the exemplary embodiments of the present invention described below may be varied modified in many different ways without departing from the inventive principles disclosed herein, and the scope of the present invention is therefore not limited to these particular following embodiments. Rather, these embodiments are provided so that this disclosure will be thorough and complete, and will fully convey the concept of the invention to those skilled in the art by way of example and not of limitation.

Hereinafter the preferred embodiments of the present invention will be explained with reference to the accompanying drawings. In the following drawings, like reference numerals identify similar or identical elements.

Figure 2:
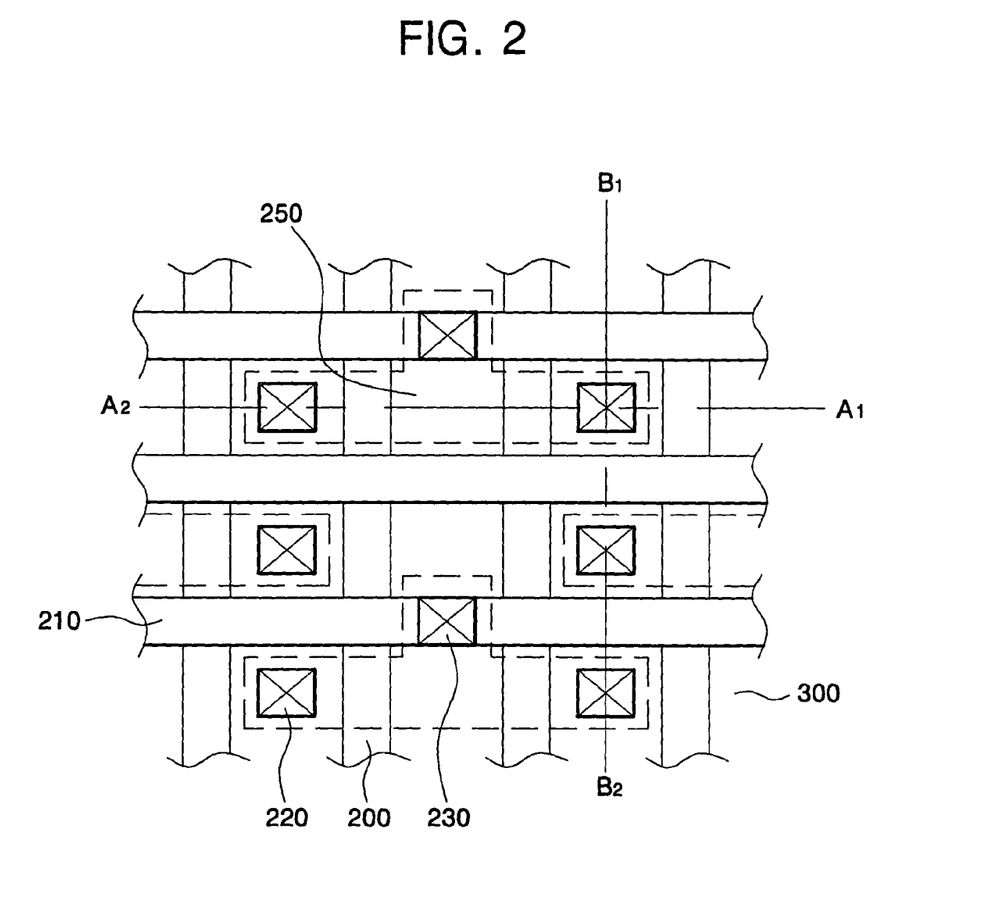
FIG. 2 is a plan view illustrating a semiconductor device according to an embodiment of the present invention.

Referring to FIG. 2, word lines 200 serving as gate electrodes are formed on a substrate 300 including active regions 250 defined thereon. In addition, bit lines 210 are formed on the substrate 300 including the word lines 200. Specifically, the word lines 200 are formed on the substrate 300 in a first direction, and the bit lines 210 are formed in a second direction substantially perpendicular to the first direction.

Source regions (not shown) of the substrate 300 are electrically connected to capacitors at first positions 220, and drain regions (not shown) of the substrate 300 are electrically connected to the bit lines 210 at second positions 230.

Figure 3A:
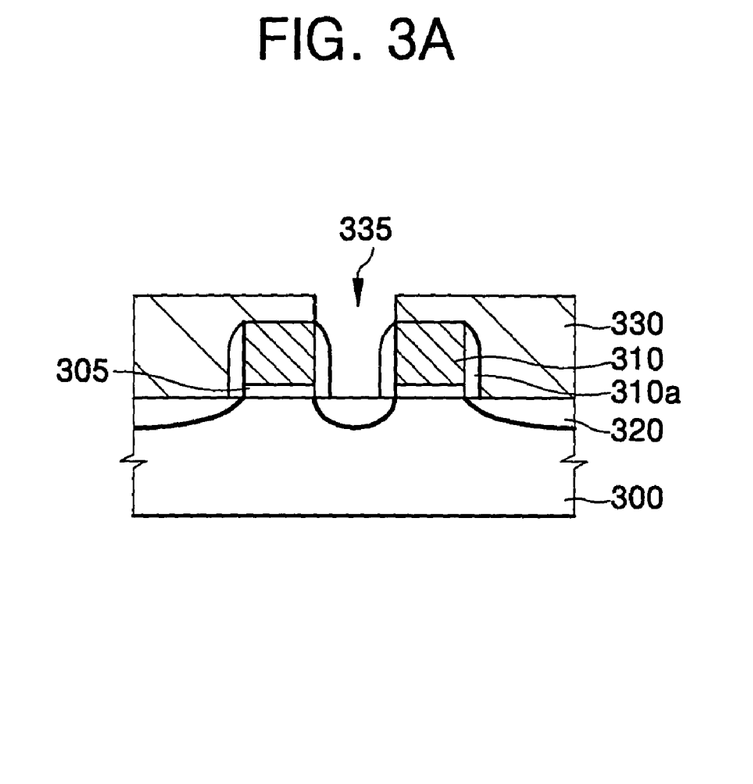
FIGS. 3A to 3D are cross-sectional views illustrating a method for forming a storage node of a capacitor taken along the line of $A_1$–$A_2$ in FIG. 2.

Referring to FIG. 3A, after the substrate 300 is divided into the active regions 250 and field regions through an isolation process, a dielectric layer such as an oxide film is formed on the substrate 300 to form gate dielectric layers 305.

Subsequently, a doped polysilicon film and a nitride film are successively formed on the oxide film. After the predetermined portion of the nitride film is etched, the portions of the doped polysilicon and the oxide films are successively etched to form the gate dielectric layers 305 and gate electrodes 310 in the active regions 250 and the field region.

After a nitride film is coated on the surface of the substrate 300 including the gate electrodes 310 formed thereon, the nitride film is anisotropically etched to form spacers 310a on the sidewalls of the gate electrodes 310.

Then, the source/drain regions 320 are formed in the substrate 300 adjacent the spacers 310a formed on the sidewalls of the gate electrodes 310 by an ion implantation process. Consequently, transistors including the gate electrodes 310 and the source/drain regions 320 are formed on the substrate 300.

Next, a first insulation film 330 is formed on the substrate 300 and on the transistors, and a photoresist pattern (not shown) is formed to partially expose the first insulation film 330. The exposed portion of the first insulation film 330 is etched using the photoresist pattern as an etching mask to form a self-aligned contact hole 335 exposing the portion of the substrate 300 between the gate electrodes 310. At this time, the first insulation film 330 is etched utilizing the etching selectivity of the first insulation film 330 relative to the nitride spacers 310a enclosing the sidewalls of the gate electrodes 310.

Figure 3B:
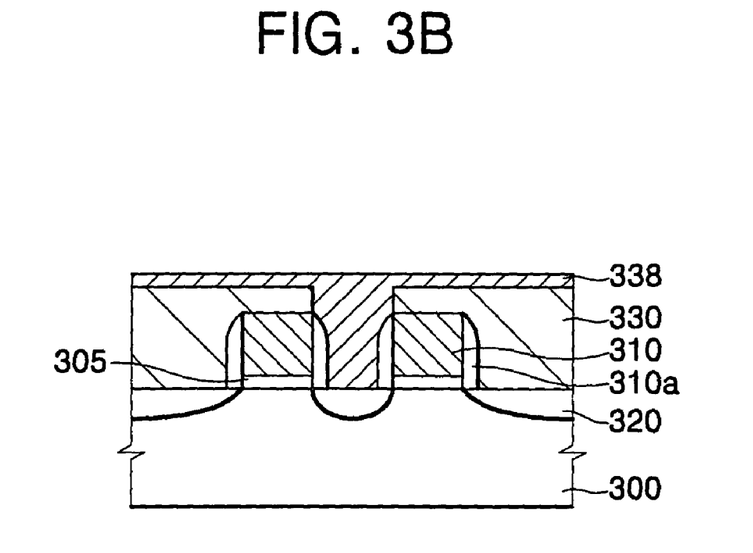

Referring to FIG. 3B, a conductive polysilicon film 338 is formed on the substrate 300 and on the first insulation film 330 to fill the self-aligned contact hole 335.

Figure 3C:
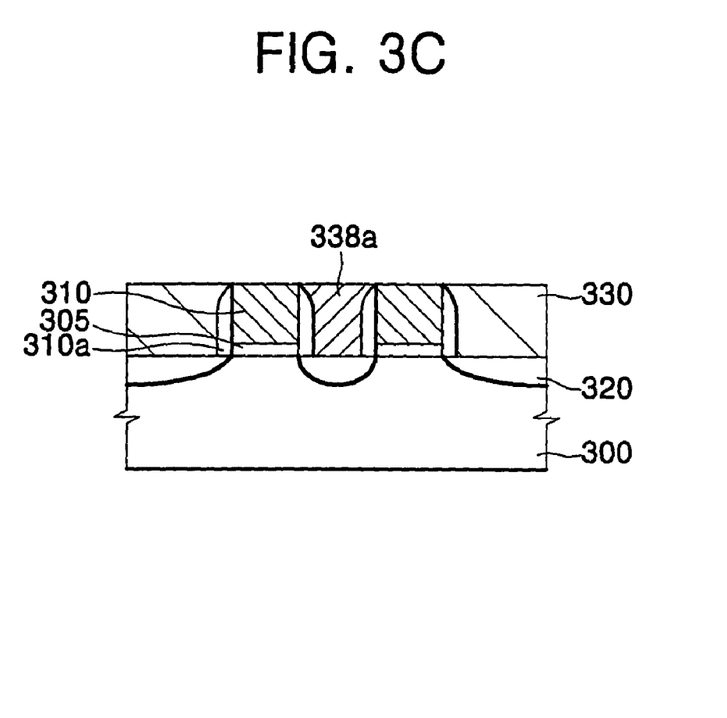

Referring to FIG. 3C, the conductive polysilicon film 338 is polished to expose the top surface of the first insulation film 330 by a chemical-mechanical polishing (CMP) process. As a result, a self-aligned contact (SAC) pad 338a is formed in the self-aligned contact hole 335.

Figure 3D:
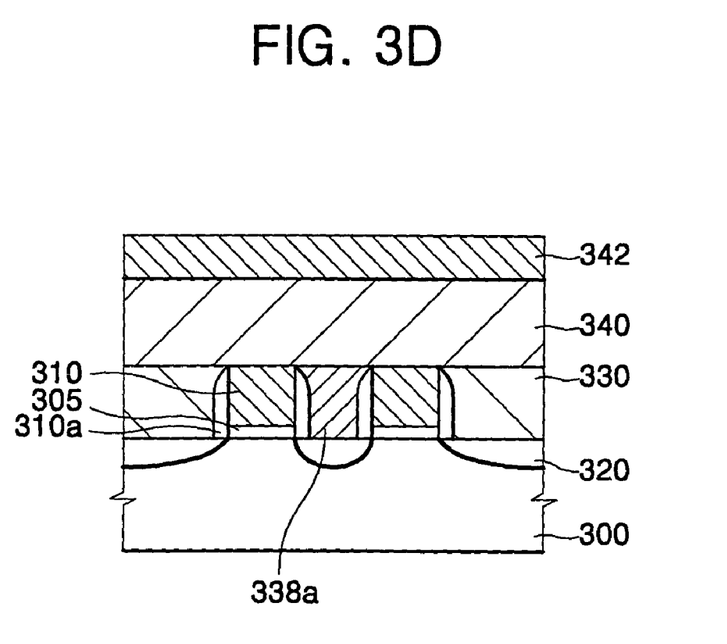

Referring to FIG. 3D, a second insulation film 340 is formed on the SAC pad 338a, on the first insulation film 330, and on the gate electrodes 310. Then, a metal layer 342 including a metal such as tungsten is formed on the second insulation film 340.

Figure 4A:
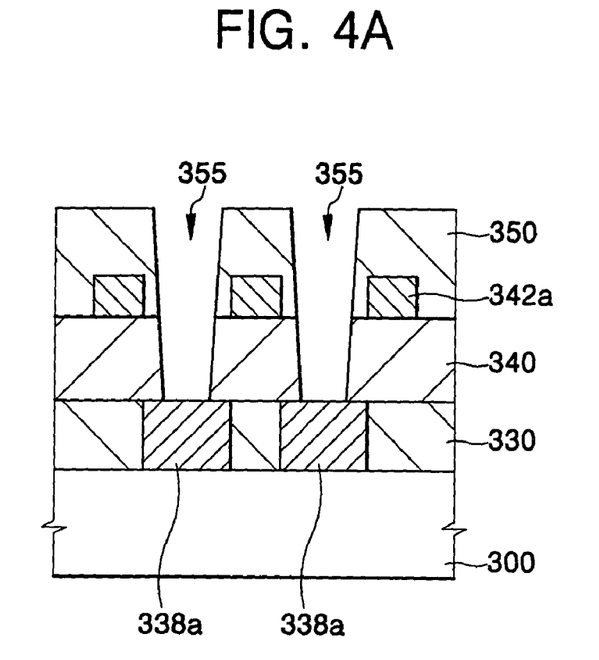
FIGS. 4A to 4K are cross-sectional views illustrating the method for forming the storage node of the capacitor taken along the line of $B_1$–$B_2$ in FIG. 2.

Referring to FIG. 4A, the metal layer 342 is patterned through a photolithography process such that the bit lines 342a are formed on the second insulation film 340. The bit lines 342a extend perpendicularly to the gate electrodes 310, and are spaced apart from the SAC pads 338a. The bit lines 342a can include additional spacers.

Subsequently, a third insulation film 350 is formed on the bit lines 342a and on the second insulation film 340. The third insulation film 350 can be a single layer or a multilayer structure.

After a photoresist pattern (not shown) is formed on the third insulation film 350 by a photolithographic process, the portions of the third insulation film 350 between the bit lines 342a are etched to expose the top surfaces of the SAC pads 338a using the photoresist pattern as an etching mask. As a result, first openings 355 are formed through the third insulation film 350. The bit lines 342a may include the spacers and the first openings 355 can be formed utilizing the etching selectivity of the third insulation film 350 relative to the bit line spacers through a self-aligned etching process. If a semiconductor device does not have the SAC pads 338a, the first openings 355 may be formed to expose underlying source/drain regions.

Figure 4B:
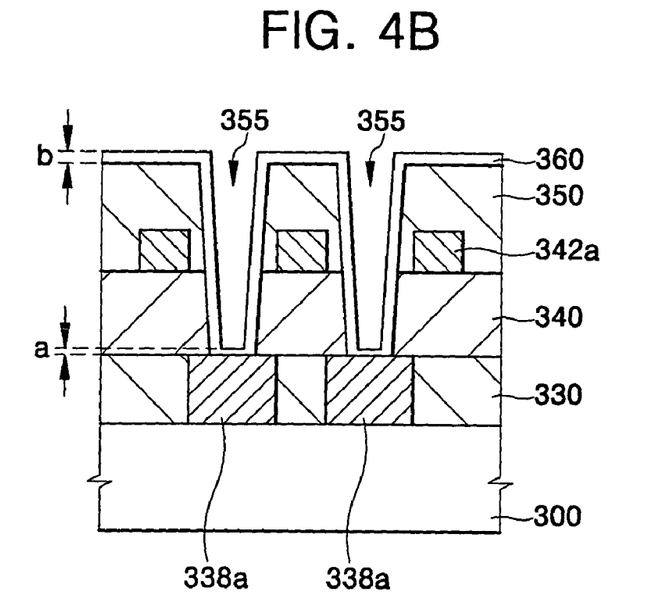

Referring to FIG. 4B, a passivation film 360 formed of a dielectric material such as silicon nitride is formed on the third insulation film 350 and in the first openings 355 by, for example, a plasma-enhanced chemical vapor deposition (PE-CVD) process, or an atmospheric pressure chemical vapor deposition (APCVD) process. The portions of the passivation film 360 formed on the third insulation film 350 and on sidewalls of the first openings 355 are thicker than other portions of the passivation film 360 on the bottom surfaces of the first openings 355. Namely, the passivation film 360 has a first thickness (indicated as "a") on the bottom surfaces of the first openings 355, and a second thickness (indicated as "b") on the third insulation film 350. Preferably, the second thickness (b) is no less than about twice the first thickness (a).

Figure 4C:
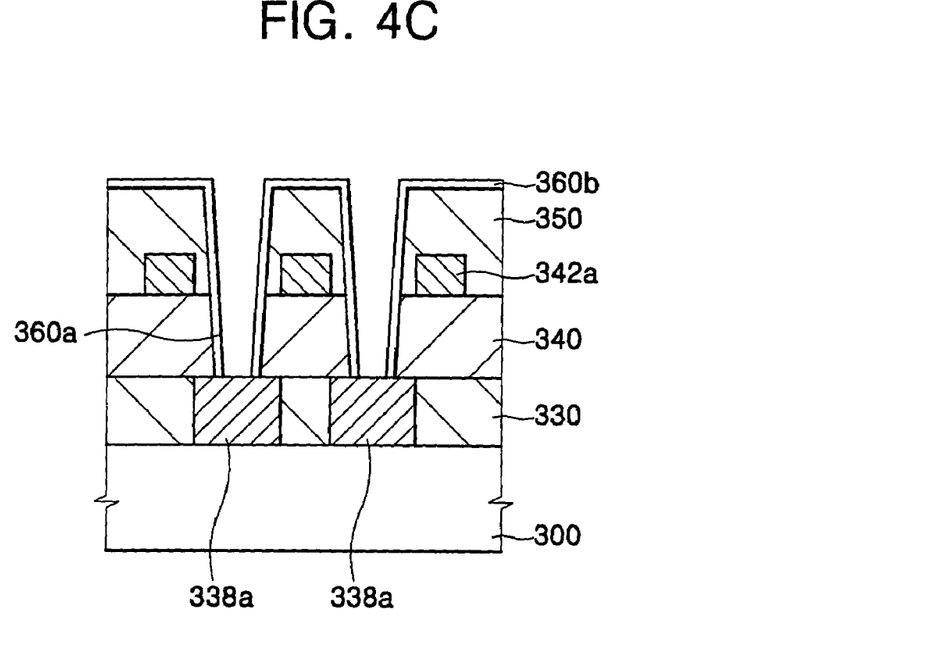

Referring to FIG. 4C, the passivation film 360 is etched to expose the bottom surfaces of the first openings 355. In particular, the etching process is simultaneously performed on the passivation film 360, until the bottom surfaces of the first openings 355 are exposed. The portions of the passivation film 360, however, remain on the third insulation film 350, and on the sidewalls of the first openings 355 because the second thickness (b) is no less than about twice the first thickness (a). Therefore, the portions of the passivation film 360 are formed as spacers 360a on the sidewalls of the first openings 355. During this process step, an etching stop film 360b is also formed on the third insulation film 350. Namely, the portion of the passivation film 360 except for the spacers 360a becomes the etching stop film 360b.

Accordingly, even if conductive patterns such as the bit lines 342a adjacent the first openings 355 are exposed through the first openings 355, device failures such as electrical shorts can be prevented during the deposition of a conductive material in the first openings 355, because nitride spacers 360a are positioned at the exposed portions of the conductive patterns, and isolate the conductive patterns from the conductive material.

As described above, the spacers 360a and the etching stop film 360b are simultaneously formed because the passivation film 360 is formed to have the step coverage in which a ratio of a top thickness to a bottom thickness is approximately 2:1 or greater. The top thickness and the bottom thickness are the thickness of the passivation film 360 on the third insulation film 350 and the thickness of the passivation film 360 on the bottom surfaces of the first openings 355, respectively. Accordingly, with embodiments of the invention, the processing time and cost can be reduced because the spacers and the etching stop film are simultaneously formed.

In one aspect of the present invention, when the conductive patterns include tungsten, oxide films may be formed on the conductive patterns during a successive thermal process. Thus, spacers should be additionally formed on the conductive patterns.

Figure 4D:
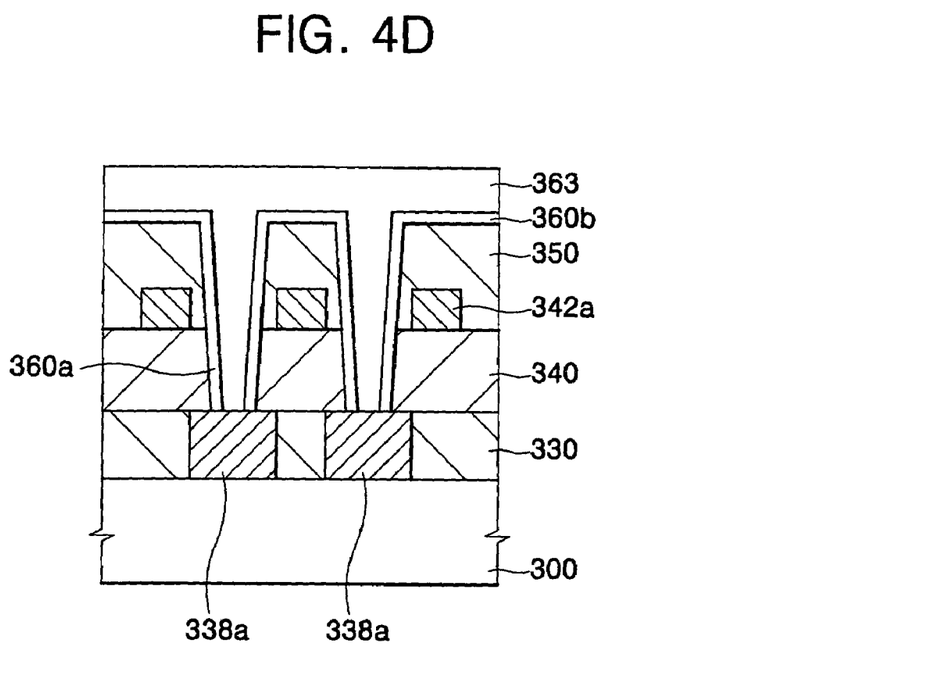

Referring to FIG. 4D, a first oxide film 363 is formed on the etching stop film 360a to fill the first openings 355. The first oxide film 363 may be formed of plasma-enhanced oxide (PE-oxide) or a plasma-enhanced tetraethylorthosilicate (PE-TEOS).

Figure 4E:
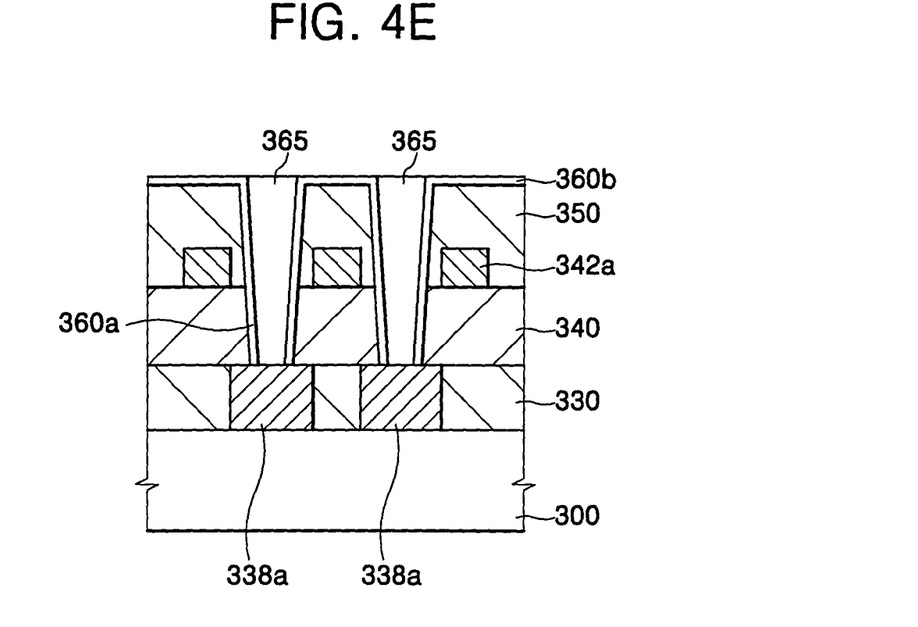

Referring to FIG. 4E, the first oxide film 363 is planarized until the etching stop film 360b is exposed by an etch back process such that first buried layers 365 filling the first openings 355 are formed.

Figure 4F:
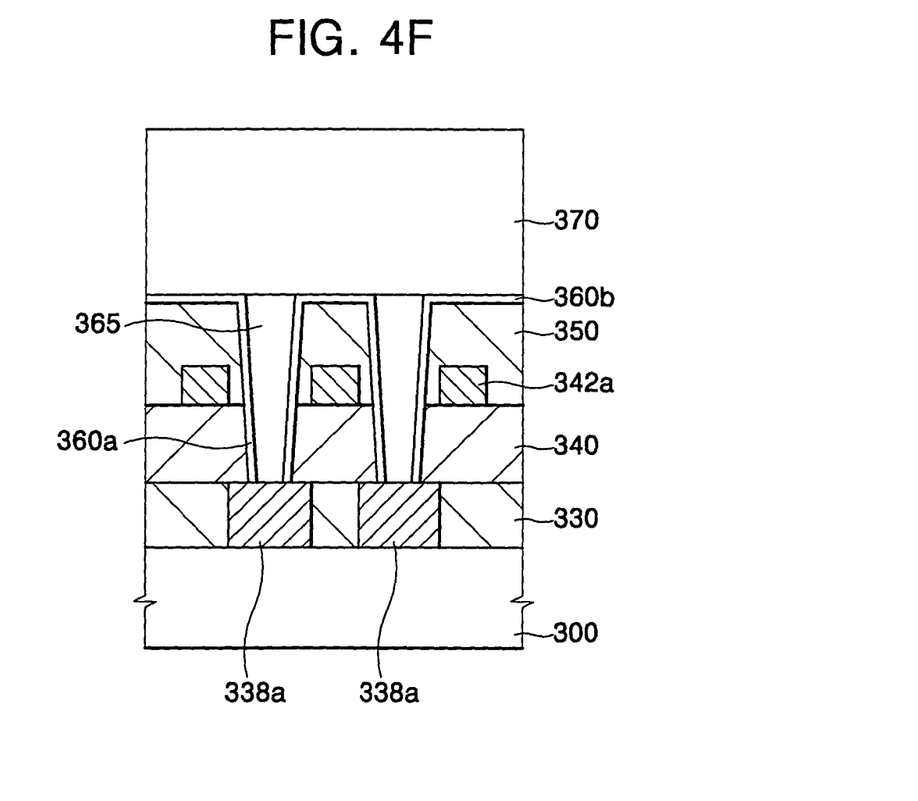

Referring to FIG. 4F, a second oxide film 370 is formed on the first buried layers 365 and on the etching stop film 360b. The second oxide film 370 may be, for example, silicon on glass (SOG). The second oxide film 370 is etched at least five times slower than the first buried layer 365 if the etching solution including SC1 (the composition in which $NH_4OH$, $H_2O_2$, and $H_2O$ are mixed by the ratio of approximately 1:1:5) is used as an etchant.

Figure 4G:
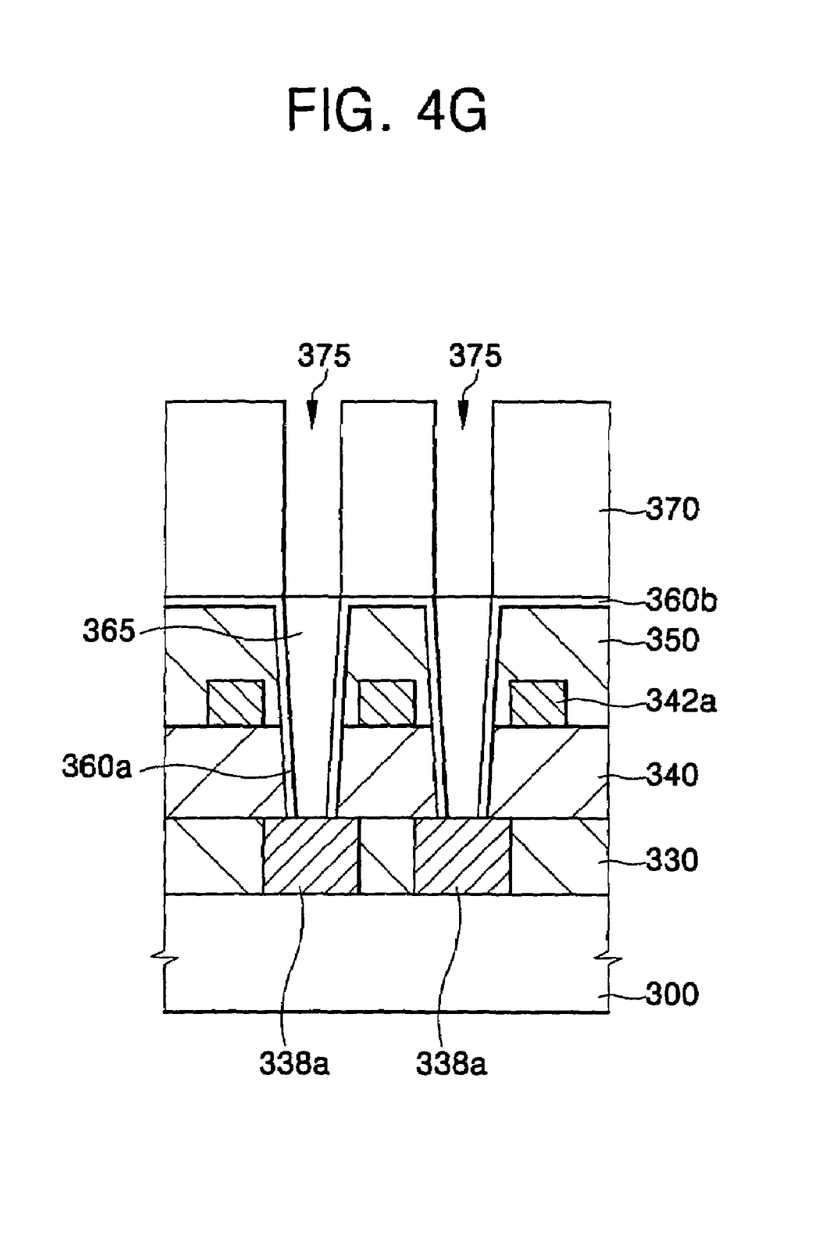

Referring to FIG. 4G, after a photoresist film (not shown) is coated on the second oxide film 370, the photoresist film is patterned to form a photoresist pattern exposing portions of the second oxide film 370 overlying the first buried layers 365.

Then, the second oxide film 370 is partially etched, using the photoresist pattern as an etching mask preferably through a dry etching process, until the top surfaces of the first buried layers 365 are exposed. Hence, second openings 375 are formed through the second oxide film 370.

Figure 4H:
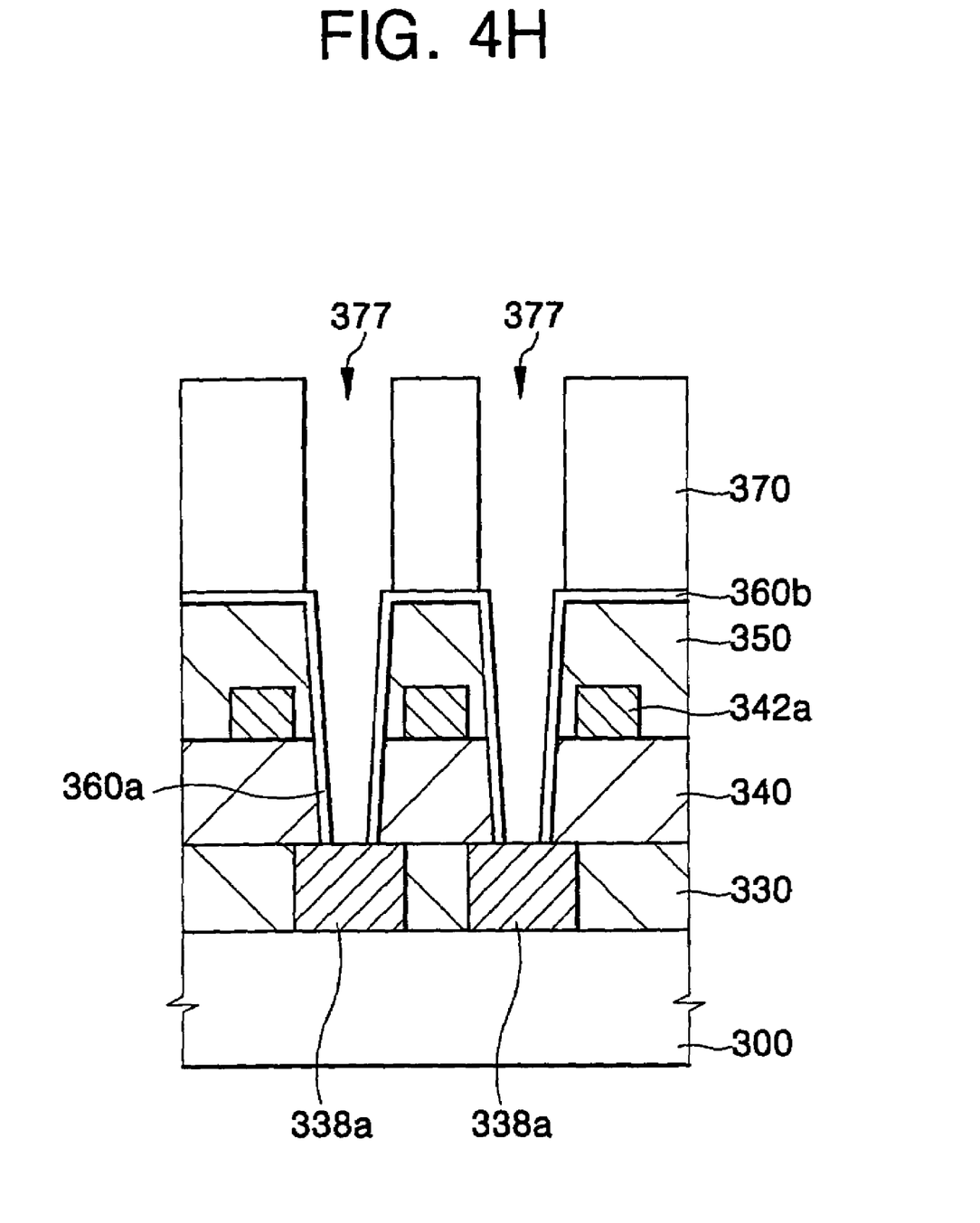

Referring to FIG. 4H, the first buried layers 365 exposed through the second openings 375 are preferably etched by a wet etching process so that opening regions 377 including the first and second openings 355 and 365 can be formed. As a result, the top surfaces of the SAC pads 338a are exposed. During the wet etching process for forming the opening regions 377, the second oxide film 370 exposed through the second openings 375 are etched at least five times slower than the first buried layers 365. Thus, the second openings 375 cannot be extended during etching the first buried layers 365.

Figure 4I:
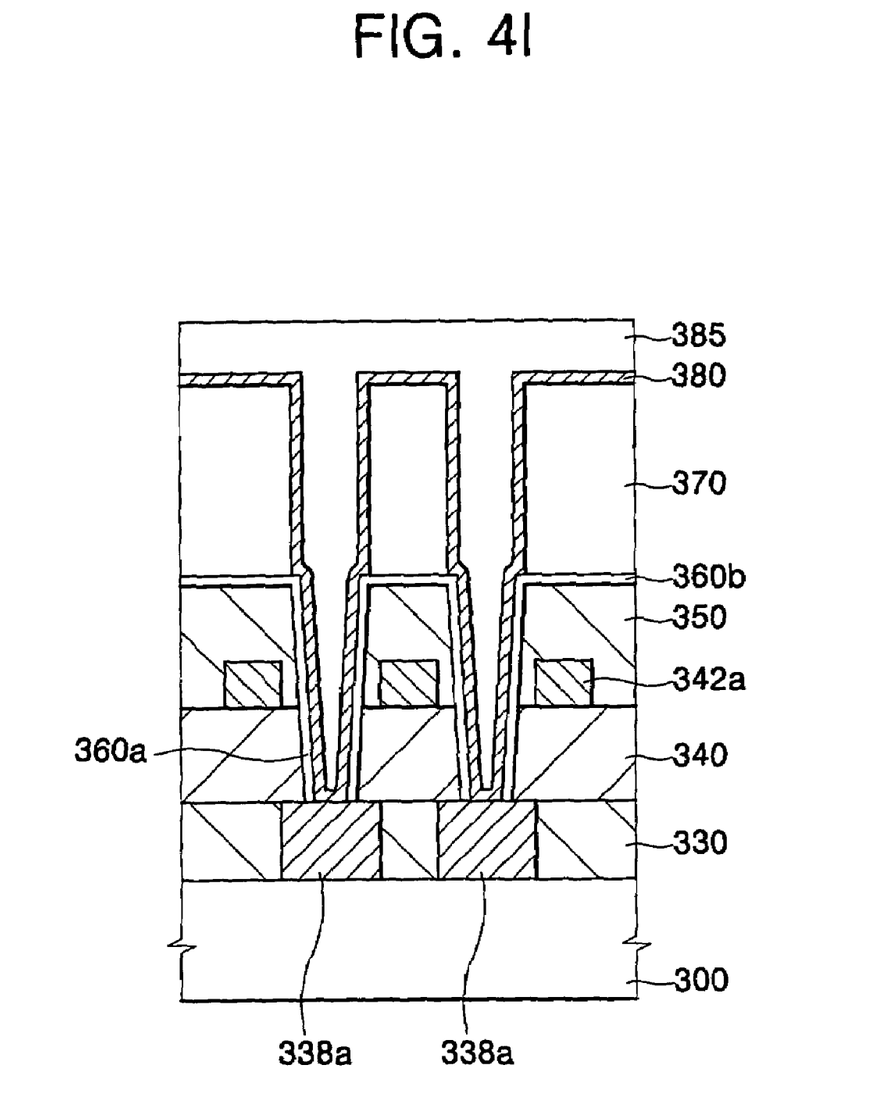

Referring to FIG. 4I, a polysilicon film 380 serving as the storage nodes of capacitors is formed on the second oxide film 370 and in the opening regions 377. The polysilicon film 380 are in electrical contact with the exposed SAC pads 338a. Then, a third oxide film 385 is formed on the polysilicon film 380 to fill the opening regions 377.

Figure 4J:
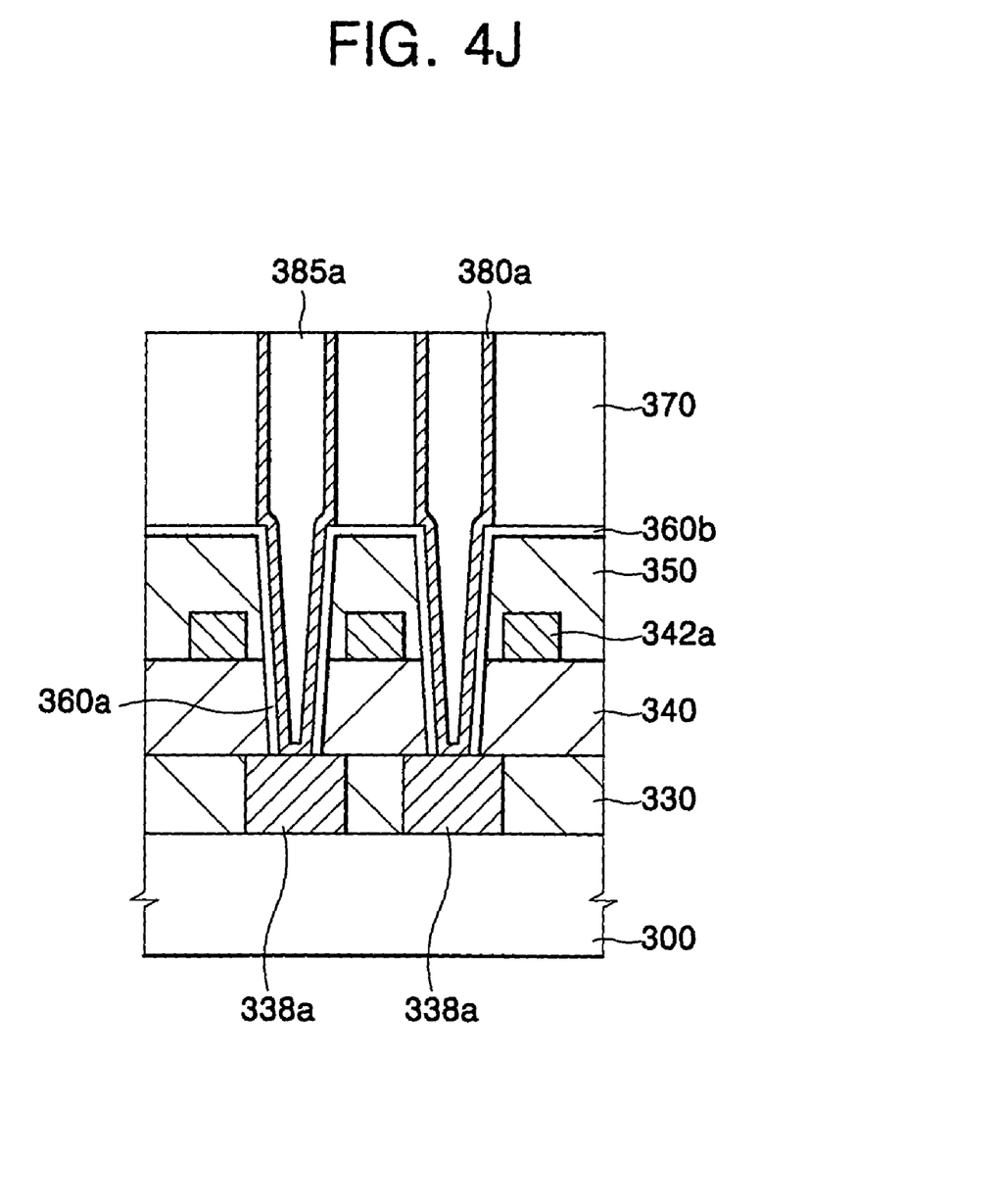

Referring to FIG. 4J, the third oxide film 385 and the polysilicon film 380 are removed by an etch back process until the top surface of the second oxide film 370 is exposed. As a result, the portions of the polysilicon film 380 are separated from each other to form storage node patterns 380a while second buried layer 385a filling the opening regions 377 are formed.

Figure 4K:
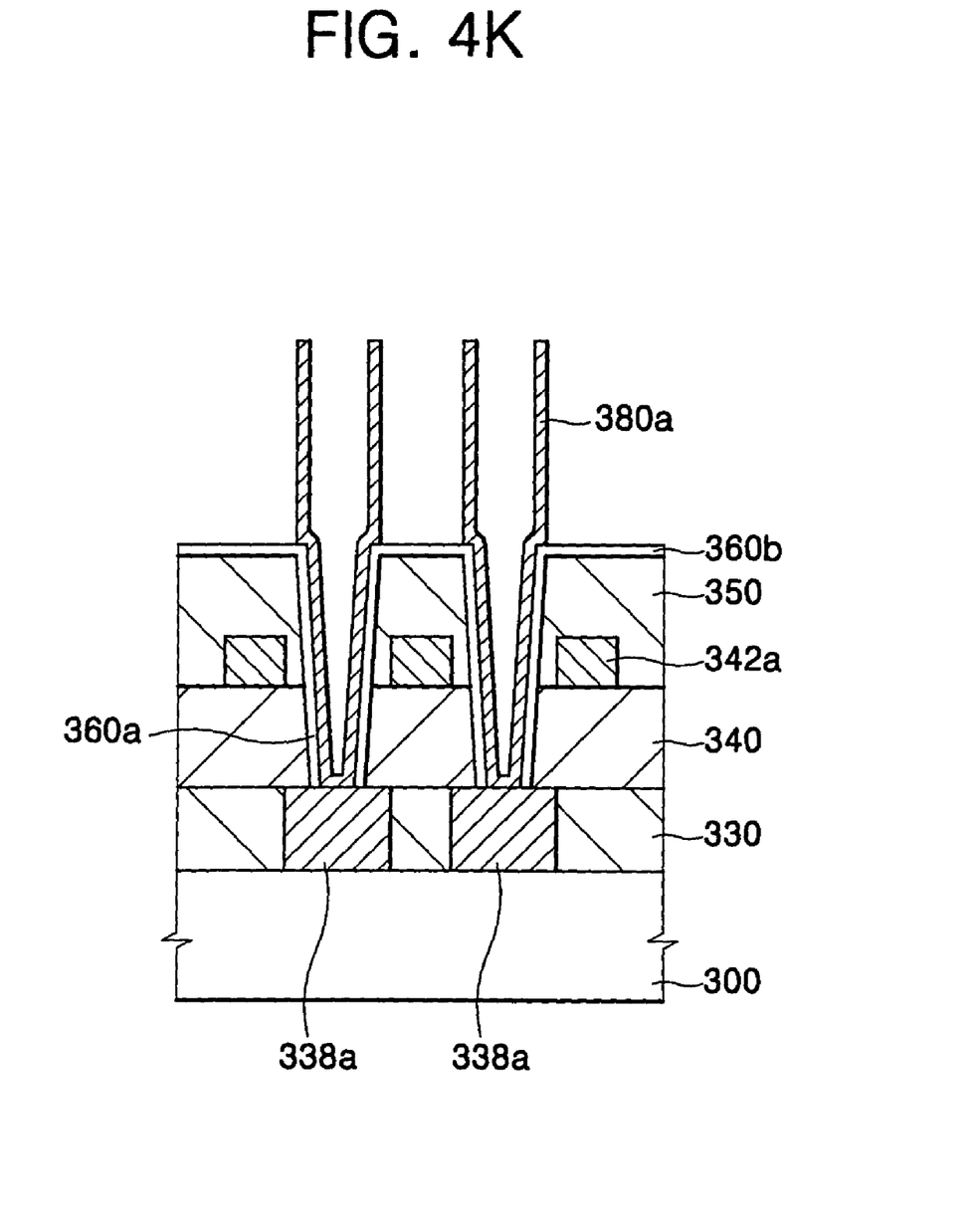

Referring to FIG. 4K, the second oxide film 370 is etched until the etching stop film 360b is exposed, and the second buried layers 385a are also etched to expose the inside of the storage node patterns 380a, thereby completing the storage nodes of the capacitors.

In summary, embodiments of the invention provide a method for forming a storage node of a capacitor, which can improve the performance of the capacitor through effective processes for forming the storage node.

An embodiment of the present invention provides a method for forming a storage node of a capacitor. In the method for forming the storage node of the capacitor, a first opening is formed through etching a portion of an insulation film formed on a semiconductor substrate, and then a passivation film is formed on the insulation film including the first opening. The portion of the passivation film positioned on a bottom of the first opening has a thickness thinner than other portions of the passivation film positioned on the insulation film and on a sidewall of the first opening.

Subsequently, the passivation film is etched to expose only the bottom of the first opening, and a buried layer is formed by filling the first opening with a first oxide.

After an interlayer dielectric film is formed through coating a second oxide on the buried layer and on the insulation film, a second opening is formed by anisotropically etching a portion of the interlayer dielectric film until a top surface of the buried layer is exposed.

Then, the first opening is exposed by wet etching the exposed buried layer through the second opening, and a conductive film is uniformly formed on the interlayer dielectric film including the first and the second openings. A conductive pattern as the storage node is formed along the first and the second openings by removing a portion of the conductive film positioned on the interlayer dielectric film, and the interlayer dielectric film is removed to form the storage node of the capacitor.

Another embodiment of the invention provides another method for forming a storage node of a capacitor. According to the embodiment, a plurality of conductive patterns are primarily formed on a first insulation film formed on a semiconductor substrate.

After a second insulation film is formed on the first insulation film including the conductive patterns, a first opening is formed through etching a portion of the second insulation film between the conductive patterns, and successively etching the first insulation film. Next, a silicon nitride film is formed on the second insulation film including the first opening wherein a portion of the silicon nitride film positioned on a bottom of the first opening has a thickness thinner than other portions of the silicon nitride film positioned on the second insulation film and on a sidewall of the first opening.

Then, the silicon nitride film is etched to expose only the bottom of the first opening, and a buried layer is formed by filling the first opening with a first oxide. After an interlayer dielectric film is formed by coating a second oxide on the buried layer and on the second insulation film, a second opening is formed by anisotropically etching a portion of the interlayer dielectric film until a top surface of the buried layer is exposed.

Subsequently, the first opening is exposed by wet etching the exposed buried layer through the second opening, and a doped polysilicon film is formed on the interlayer dielectric film including the first and the second openings.

Finally, a doped polysilicon pattern is formed along the first and second openings by removing a portion of the doped polysilicon film positioned on the interlayer dielectric film, and the second oxide film is removed using the silicon nitride film as an etching stop film.

According to the present invention, spacers and the etching stop film can be simultaneously formed, and the storage node can be stably formed so that the performance and the capacitance of the capacitor can be improved.

As it is described above, according to embodiments of the invention, the passivation film is formed on the oxide film and in the openings for forming the storage nodes of the capacitor so that the spacers for the openings and the etching stop film can be simultaneously formed. Also, the opening region for forming the storage node of the capacitor is formed through two etching processes of the dry and the wet such that the upper portion of the storage node can have a vertically stable structure while the lower portion of the storage node supported by the insulation film can make direct contact with the underlying conductive region.

Therefore, the cost and the time for forming the capacitor can be reduced because various elements of the capacitor can be precisely formed. In addition, the storage node can be stably supported through the insulation film, and the capacitor having the storage node can have an improved capacitance.

The present invention has been described with reference to various exemplary embodiments thereof. The scope of the present invention must not be interpreted, however, as being restricted to these exemplary embodiments. Rather, it will be apparent to those of ordinary skill in the art that various modifications may be made to the described embodiments without departing from the spirit and scope of the invention.

What is claimed is:

1. A method for forming a storage node of a capacitor, the method comprising:
    etching a portion of an insulation film on a semiconductor substrate, thereby forming a first opening in the insulation film;
    forming a passivation film on the insulation film and within the first opening thereof, wherein a portion of the passivation film on a bottom of the first opening is predetermined to be thinner than portions of the passivation film on the insulation film and on sidewalls of the first opening, and wherein the thickness of the portion of the passivation film on the sidewalls is substantially constant;
    etching the passivation film until the bottom of the first opening is exposed, while leaving at least a portion of the passivation film on a top surface of the insulation film and on the sidewalls of the first opening;
    filling the first opening with a buried layer;
    forming an interlayer dielectric film on the buried layer and on the insulation film;
    anisotropically etching a portion of the interlayer dielectric film, until a top surface of the buried layer is exposed, to form a second opening in the interlayer dielectric film;
    wet etching the exposed buried layer through the second opening to form opening regions;
    forming a conductive film on the interlayer dielectric film including the opening regions; and
    removing a portion of the conductive film on the interlayer dielectric film to form a conductive pattern as a storage node.

2. The method of claim 1, wherein etching the passivation film comprises simultaneously forming sidewall spacers on the sidewalls of the first opening and an etch stop layer on the insulation film.

3. The method of claim 1, further comprising removing the interlayer dielectric film after forming the conductive pattern.

4. The method of claim 1, wherein the passivation film is formed by a plasma enhanced chemical vapor deposition process or an atmospheric pressure chemical vapor deposition process.

5. The method of claim 1, wherein the passivation film comprises silicon nitride.

6. The method of claim 1, wherein the thickness of the portion of the passivation film on the bottom of the first opening is no more than approximately half the thickness of other portions of the passivation film on the insulation film and on the sidewalls of the first opening.

7. The method of claim 1, wherein the first opening exposes a surface of the semiconductor substrate.

8. The method of claim 1, wherein the first opening exposes a conductive pad formed on the semiconductor substrate.

9. The method of claim 1, wherein the conductive pattern is formed adjacent to the first opening.

10. The method of claim 1, wherein filling the first opening with the buried layer comprises:
    filling the first opening with a first oxide film; and
    planarizing the first oxide film, using the passivation film as an etching stop film.

11. The method of claim 1, wherein the buried layer is wet etched at least five times faster than the interlayer dielectric film.

12. The method of claim 1, wherein, during forming a conductive pattern, the passivation film serves as an etch stop film.

13. A method for forming a storage node of a capacitor comprising:
    forming a plurality of conductive patterns on a first insulation film formed on a semiconductor substrate;
    forming a second insulation film on the first insulation film including the conductive patterns formed thereon;
    forming a first opening by etching a portion of the second insulation film between the conductive patterns, and successively etching the first insulation film;
    forming a silicon nitride film on the second insulation film including the fir st opening wherein a portion of the silicon nitride film positioned on a bottom of the first opening is thinner than other portions of the silicon nitride film positioned on the second insulation film and on a sidewall of the first opening;
    etching the silicon nitride film to expose the bottom of the first opening;
    thereafter, forming a buried layer by filling the first opening with a first oxide;
    forming an interlayer dielectric film by coating a second oxide on the buried layer and on the second insulation film;
    forming a second opening by anisotropically etching a portion of the interlayer dielectric film until a top surface of the buried layer is exposed;
    exposing the first opening by wet etching the exposed buried layer through the second opening;
    uniformly forming a doped polysilicon film on the interlayer dielectric film including the first and the second openings;
    forming a doped polysilicon pattern along the first and the second openings by removing a portion of the doped polysilicon film positioned on the interlayer dielectric film; and
    removing the interlayer dielectric film using the silicon nitride film as an etch stop film.

14. The method of claim 13, wherein the passivation film is formed by a chemical vapor deposition process.

15. The method of claim 14, wherein the chemical vapor deposition process is selected from the group consisting of a plasma enhanced chemical vapor deposition process and an atmospheric pressure chemical vapor deposition process.

16. The method of claim 13, wherein the conductive patterns include tungsten.

17. The method of claim 13, wherein the first opening is a self-aligned contact hole.

18. A method comprising:
    forming a fast opening by etching a portion of an insulation film formed on a semiconductor substrate;
    forming a passivation film over the semiconductor substrate with a portion of the passivation film positioned on a bottom of the first opening thinner than a portion of the passivation film positioned on the insulation film and thinner than a portion of the passivation film positioned on sidewalls of the first opening;
    exposing the bottom of the first opening by etching the passivation film;
    thereafter, forming a buried layer by filling the first opening with a first oxide;
    forming an interlayer dielectric film by coating a second oxide on the buried layer and on the insulation film;
    forming a second opening by anisotropically etching a portion of the interlayer dielectric film until a top surface of the buried layer is exposed;
    exposing the first opening by wet etching the exposed buried layer through the second opening;
    forming a conductive film on the interlayer dielectric film including the first and the second openings; and
    forming a conductive pattern configured as a storage node along the first and the second openings by removing a portion of the conductive film positioned on the interlayer dielectric film.

19. The method of claim 18, further comprising removing the interlayer dielectric film after forming the conductive pattern.

20. The method of claim 18, wherein the passivation film is formed by a plasma enhanced chemical vapor deposition process or an atmospheric pressure chemical vapor deposition process.

21. The method of claim 18, wherein the passivation film comprises silicon nitride.

22. The method of claim 18, wherein forming a passivation film over the semiconductor substrate further comprises forming the portion of the passivation flint positioned on the bottom of the first opening to be no thicker than half a thickness of the portion of the passivation film positioned on the insulation film and no thicker than half thickness of the portion of the passivation film positioned on the sidewall of the first opening.

23. The method of claim 18, wherein the first opening exposes a surface of the semiconductor or a conductive pad formed on the semiconductor.

24. The method of claim 18, wherein exposing the first opening by wet etching the exposed buried layer through the second opening further comprises wet etching the buried layer at a rate at least five times greater than a rate that the interlayer dielectric film was etched.

25. The method of claim 18, wherein forming the conductive pattern configured as the storage node along the first and the second openings by removing a portion of the conductive film positioned an the interlayer dielectric film further comprises, using the passivation film as an etch stop film, leaving a portion of the passivation film on the insulation film and on the sidewalls of the first opening.

* * * * *

UNITED STATES PATENT AND TRADEMARK OFFICE
CERTIFICATE OF CORRECTION

PATENT NO. : 7,074,725 B2  Page 1 of 1
APPLICATION NO. : 10/641636
DATED : July 11, 2006
INVENTOR(S) : Jun-Sik Hong et al.

It is certified that error appears in the above-identified patent and that said Letters Patent is hereby corrected as shown below:

Column 10, line 6, the word "fast" should read -- first --;
Column 10, line 60, the word "an" should read -- on --.

Signed and Sealed this

Eleventh Day of August, 2009

David J. Kappos
*Director of the United States Patent and Trademark Office*